United States Patent
Kim

(10) Patent No.: US 11,391,773 B2
(45) Date of Patent: Jul. 19, 2022

(54) SEMICONDUCTOR INTEGRATED CIRCUIT FOR DETECTING LEAKAGE CURRENT AND EARTH LEAKAGE CIRCUIT BREAKER HAVING THE SAME

(71) Applicant: SunnyIC Corporation, Seoul (KR)

(72) Inventor: Sun-Jung Kim, Seoul (KR)

(73) Assignee: SUNNYIC CORPORATION, Seoul (KR)

( * ) Notice: Subject to any disclaimer, the term of this patent is extended or adjusted under 35 U.S.C. 154(b) by 276 days.

(21) Appl. No.: 16/847,615

(22) Filed: Apr. 13, 2020

(65) Prior Publication Data

US 2020/0333395 A1    Oct. 22, 2020

(30) Foreign Application Priority Data

Apr. 16, 2019    (KR) .................. 10-2019-0044542

(51) Int. Cl.
| | | |
|---|---|---|
| G01R 31/30 | (2006.01) | |
| G01R 31/52 | (2020.01) | |
| H01H 83/02 | (2006.01) | |
| H02H 3/33 | (2006.01) | |

(52) U.S. Cl.
CPC ......... *G01R 31/3008* (2013.01); *G01R 31/52* (2020.01); *H01H 83/02* (2013.01); *H02H 3/337* (2013.01)

(58) Field of Classification Search
CPC .... G01R 31/3008; G01R 31/52; G01R 15/18; G01R 19/0023; G01R 19/16576; G01R 31/3277; G01R 31/327; H01H 83/02; H01H 83/04; H02H 3/337; H02H 3/33; H02H 3/325; H02H 3/16; H02H 3/338; H01R 13/7135

See application file for complete search history.

(56) References Cited

U.S. PATENT DOCUMENTS

| | | | | |
|---|---|---|---|---|
| 4,234,900 A | * | 11/1980 | Miyazaki ................. | H02H 3/33 361/45 |
| 4,833,564 A | * | 5/1989 | Pardue .................... | H02H 3/335 361/93.6 |
| 5,224,007 A | * | 6/1993 | Gill, Jr. .................... | H02H 3/33 361/45 |

OTHER PUBLICATIONS

FAN1851A, Ground Fault Interrupter, Fairchild Semiconductor, 2005 (Year: 2005).*

* cited by examiner

*Primary Examiner* — Daniel R Miller
(74) *Attorney, Agent, or Firm* — TIPS Group

(57) ABSTRACT

The present invention provides a semiconductor integrated circuit for detecting leakage current to determine whether an electric leakage occurs in an electric line based on an induced voltage input from a leakage current detection unit 20 installed in the electric line, and an earth, leakage circuit breaker having the semiconductor integrated circuit. A semiconductor integrated circuit 100 for detecting leakage current includes: a signal amplification unit 110 configured to amplify the induced voltage; an interruption determination unit 130 configured to compare an output voltage output from the signal amplification unit with a preset reference voltage, and output an interruption signal for interrupting a power supply to the electric line; a flare current stabilization (FCS) circuit 150 for a signal amplification unit connected to the signal amplification unit; and a flare current stabilization (FCS) circuit 170 for an interruption determination unit connected to the interruption determination unit.

12 Claims, 4 Drawing Sheets

SEMICONDUCTOR INTEGRATED CIRCUIT FOR DETECTING LEAKAGE CURRENT AND EARTH LEAKAGE CIRCUIT BREAKER HAVING THE SAME

CROSS REFERENCE TO RELATED APPLICATION(S)

This application claims priority to Korean Patent Application No. 10-2019-0044542, filed on Apr. 16, 2019 in the Korean Intellectual Property Office, the entire disclosure of which is incorporated herein by reference.

BACKGROUND OF THE INVENTION

1. Field of the Invention

The present invention relates to a semiconductor integrated circuit for detecting leakage current and an earth leakage circuit breaker having the semiconductor integrated circuit.

2. Description of the Related Art

As a device for detecting electric leakage due to ground faults in various electric lines or load-side electric devices, and cutting off electrical power to the electric line or load-side electric device to interrupt a power supply to the electric line or device when detecting a leakage current, an earth leakage circuit breaker has been widely used.

FIG. 1 is a block diagram illustrating a configuration of a conventional earth leakage circuit breaker. As shown in FIG. 1, the conventional earth leakage circuit breaker includes a semiconductor integrated circuit 10 for detecting leakage current and an interruption unit 19. In general, if an electric leakage occurs in an electric line, etc., a leakage current detection unit 20 installed in the electric line detects a leakage current to output an induced current, and the induced current is converted into an induced voltage by an input resistance Rin. Then, the induced voltage is input to a signal amplification unit 11 of the semiconductor integrated circuit 10 for detecting leakage current, and the input induced voltage of several mV is subjected to amplification in the signal amplification unit 11, and then the amplified voltage is output to an interruption determination unit 13 of the semiconductor integrated circuit 10 for detecting leakage current.

The interruption determination unit 13 is configured to determine whether an electric leakage occurs in the electric line based on the input signal from the signal amplification unit 11, and when it is determined to be in an electric leakage state as a result of the determination, the interruption unit 19 outputs an interrupt signal for interrupting a power supply to the electric line to perform an interruption operation. For example, Patent Documents 1 and 2, etc. disclose a leakage current detection device for an earth leakage circuit breaker having the above-described basic configuration.

Herein, a magnitude of the leakage current that causes the earth leakage circuit breaker to perform the interruption operation, and more precisely, the leakage current (ground fault current) that causes the earth leakage circuit breaker to be switched from a normal use state is referred to as a sensitivity current of the earth leakage circuit breaker. When the sensitivity current is 5 mA to 30 mA and 100 mA to 1,000 mA, it may be classified into a high-sensitivity type and a medium-sensitivity type earth leakage circuit breakers, respectively. In addition, the international electrotechnical commission (IEC) 61008 defines that the sensitivity current of the high-sensitivity type earth leakage circuit breaker is 30 mA or less and an operating speed thereof is 30 ms, as well as a variation $\Delta$ in the sensitivity current of the earth leakage circuit breaker to satisfy the above conditions should be within a range of 5 mA or less.

Meanwhile, FIG. 2 is a graph illustrating results of the sensitivity current measured in the earth leakage circuit breaker depending on an IC consumption current (ICC) of a typical semiconductor integrated circuit for detecting leakage current of the prior art.

As can be seen from FIG. 2, the variation $\Delta$ in the sensitivity current of the earth leakage circuit breaker is proportional to a variation $\Delta$ in the ICC of the semiconductor integrated circuit for detecting leakage current. The variation $\Delta$ in the ICC of the conventional semiconductor integrated circuit for detecting leakage current is 250 µA, and thus the variation $\Delta$ in the sensitivity current of the earth leakage circuit breaker is 13 mA. Therefore, in a case of the conventional earth leakage circuit breaker, it is impossible to maintain the sensitivity current within a range of 5 mA (±2.5 mA) or less, which is a defined control range of the sensitivity current in the high-sensitivity type earth leakage circuit breaker.

The reason is that, in a case of a MOSFET element implemented in a bipolar-CMOS-DMOS (BCD) process, the variation of a channel formed in a gate is increased toward a micro process of 3 µm or less (which is referred to as a short channel effect), and the variation $\Delta$ in the ICC of the semiconductor integrated circuit for detecting leakage current in the conventional earth leakage circuit breaker is increased due to the above effect. Therefore, there is a problem that the variation $\Delta$ in the sensitivity current of the conventional earth leakage circuit breaker manufactured by the BCD process is also increased in proportion to the increase of the variation $\Delta$ in the ICC.

As a solution for solving the above-described problem, conventionally, there is a method of dividing a sensitivity current section of the semiconductor integrated circuit for detecting leakage current into three or more sections, for example, 15 to 21 mA, 21 to 26 mA, and 26 to 32 mA through a test process, and applying input resistances Rin having different resistance values for each section. However, since this method uses a plurality of resistance elements which are different for each section, there are problems that the structure is complicated and manufacturing costs are increased, as well as the operating speed deviates from 30 ms depending on the variation in the sensitivity current.

However, as confirmed by the present inventors, no prior art document that can solve the above problems of the prior art has been found. See, for example, Korean Patent Laid-Open Publication No. 10-2010-0080188 (published on Jul. 8, 2010) and Japanese Patent Laid-Open Publication No. S57-95132 (published on Jun. 12, 1982).

SUMMARY OF THE INVENTION

In consideration of the above-described problems of the prior art, it is an object of the present invention to provide a semiconductor integrated circuit for detecting leakage current and an earth leakage circuit breaker having the semiconductor integrated circuit, that can reduce a variation $\Delta$ in the sensitivity current by applying flare current stabilization circuits (hereinafter, often briefly referred to as "FCS circuits") which are independent of a short channel effect to a signal amplification unit and an interruption determination unit of a conventional semiconductor integrated circuit for detecting leakage current manufactured by a BCD process.

To achieve the above object, according to an aspect of the present invention, there is provided a semiconductor integrated circuit for detecting leakage current configured to determine whether an electric leakage occurs in an electric line based on an induced voltage input from a leakage current detection unit installed in the electric line, the semiconductor integrated circuit for detecting leakage current including: a signal amplification unit configured to amplify the induced voltage; an interruption determination unit configured to compare an output voltage output from the signal amplification unit with a preset reference voltage for determining whether to cut off an electrical power, and output an interruption signal for interrupting a power supply to the electric line when the output voltage is the reference voltage or more; and a flare current stabilization (FCS) circuit for a signal amplification unit connected to the signal amplification unit to stabilize a flare current in the signal amplification unit, e.g. a current in the signal amplification unit that is subject to unwanted variation.

In addition, according to another aspect of the present invention, there is provided an earth leakage circuit breaker including: the above semiconductor integrated circuit for detecting leakage current; and an interruption unit configured to cut off an electrical power to the electric line based on an interruption signal from the semiconductor integrated circuit for detecting leakage current.

According to the present invention, it is possible to greatly reduce variations in sensitivity currents of the semiconductor integrated circuit for detecting leakage current and the earth leakage circuit breaker having the semiconductor integrated circuit, and thereby providing an earth leakage circuit breaker with high reliability and safety in an operation thereof.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Hereinafter, a semiconductor integrated circuit for detecting leakage current and an earth leakage circuit breaker having the semiconductor integrated circuit according to a preferred embodiment of the present invention will be described in detail with reference to the accompanying drawings.

Figure 1:
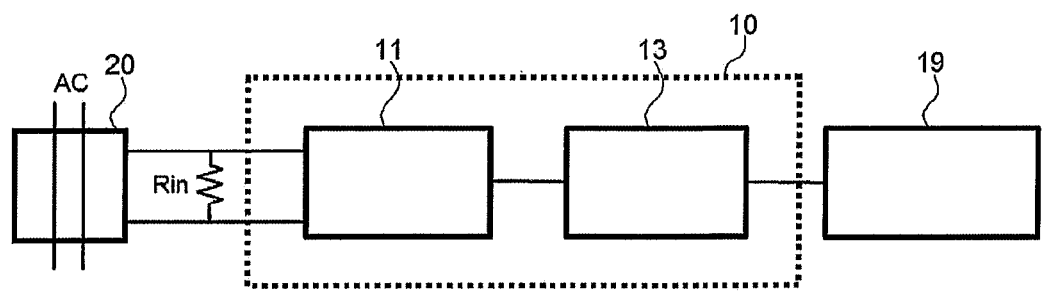
FIG. 1 is a block diagram illustrating a configuration of a typical earth leakage circuit breaker of the prior art.
Figure 2:
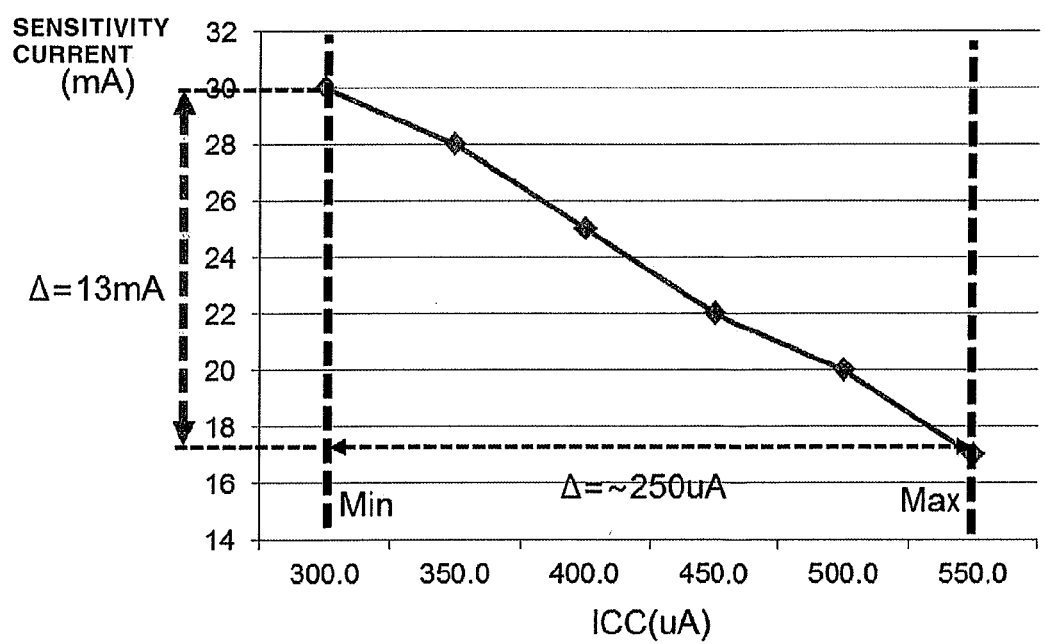
FIG. 2 is a graph illustrating results of the sensitivity current measured in the earth leakage circuit breaker depending on a consumption current of a typical semiconductor integrated circuit for detecting leakage current of the prior art.
Figure 3:
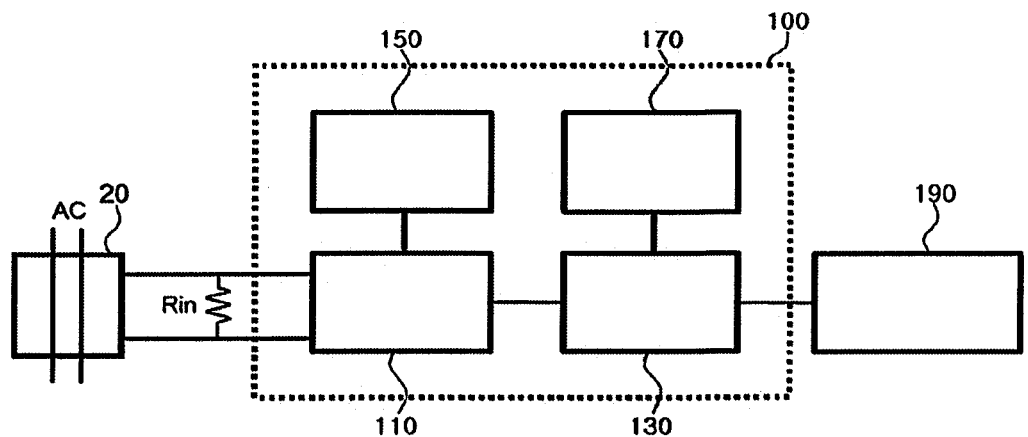
FIG. 3 is a block diagram illustrating a configuration of an earth leakage circuit breaker according to a preferred embodiment of the present invention.

First, a schematic configuration of the earth leakage circuit breaker according to the preferred embodiment of the present invention will be described. FIG. 3 is a block diagram illustrating a configuration of the earth leakage circuit breaker according to the preferred embodiment of the present invention.

As shown in FIG. 3, the earth leakage circuit breaker according to the preferred embodiment of the present invention includes: a leakage current detection unit 20; a semiconductor integrated circuit 100 for detecting leakage current including a signal amplification unit 110, a flare current stabilization (FCS) circuit 150 for a signal amplification unit (hereinafter, referred to as an "FCS circuit 150 for a signal amplification unit"), an interruption determination unit 130, and a flare current stabilization (FCS) circuit 170 for an interruption determination unit (hereinafter, referred to as an "FCS circuit 170 for an interruption determination unit"); and an interruption unit 190 configured to cut off an electric power to an electric line when it is determined to be in an electric leakage state as a result of a determination by the determination unit 130 of the semiconductor integrated circuit 100 for detecting leakage current.

If an electric leakage occurs in the electric line, etc., the leakage current detection unit 20 installed in the electric line detects the electric leakage to output an induced current. Then, the induced current is converted into an induced voltage by an input resistance Rin and is output to the signal amplification unit 110 of the semiconductor integrated circuit 100 for detecting leakage current.

The leakage current detection unit 20 is configured to detect a leakage current generated in an electric line or a load-side electric device, etc., and may be, for example, a zero-current transformer (ZCT) installed in the electric line or the load-side electric device. However, the present invention is not limited thereto, and may include all means capable of detecting a leakage current generated in the electric line or the load-side electric device, etc., in which the earth leakage circuit breaker of the present invention is installed.

The signal amplification unit 110 is configured to amplify the induced voltage in which the induced current output from the leakage current detecting unit 20 is converted into a voltage of several mV by the input resistance Rin when the electric leakage occurs in the electric line, etc.

The interruption determination unit 130 is configured to compare the output voltage which is amplified by and output from the signal amplification unit 110 with a preset reference voltage used for determining whether to cut off an electrical power, and output an interruption signal for performing an interruption operation to the interruption unit 190 when the output voltage is the reference voltage or more.

The interruption unit 190 includes a coil (not illustrated), an output unit including an actuator or plunger (not illustrated), etc., and a switching mechanism (not illustrated). When the coil is magnetized by the interruption signal output from the interruption determination unit 130, the switching mechanism moves the output unit to an operation position by a magnetic force of the coil, thus to automatically perform the interruption operation in the electric line.

The signal amplification unit 110, the interruption determination unit 130, and the interruption unit 190 have well-known configurations, and therefore will not be further described in detail.

Next, the FCS circuit 150 for a signal amplification unit and the FCS circuit 170 for an interruption determination unit of the semiconductor integrated circuit 100 for detecting leakage current will be described with reference to FIG. 4.

Figure 4:
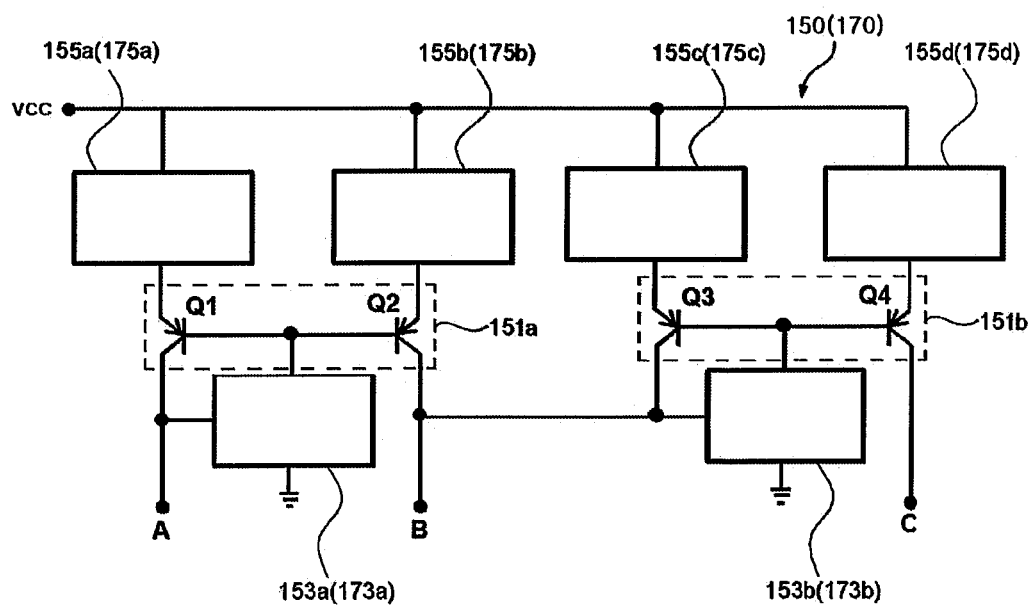
FIG. 4 is a view illustrating configurations of FCS circuits.

FIG. 4 is a view illustrating configurations of the FCS circuits. Since the FCS circuit 150 for a signal amplification unit and the FCS circuit 170 for an interruption determination unit have the same configuration as each other, hereinafter, the configuration and operation thereof will be described in detail based on the FCS circuit 150 for a signal amplification unit.

The FCS circuit 150 for a signal amplification unit functions to stabilize a flare current in the signal amplification unit 110. As shown in FIG. 4, the FCS circuit 150 for a signal amplification unit includes: a pair of current mirror circuits 151a and 151b including PNP type transistors Q1 and Q2 and PNP type transistors Q3 and Q4, respectively; base current supplies 153a and 153b commonly connected to bases of the transistors Q1 and Q2 and bases of the transistors Q3 and Q4 included in the pair of current mirror circuits 151a and 151b to supply the same amount of base current as each other to the transistors Q1 and Q2 and the transistors Q3 and Q4, respectively; and current adjusters 155a, 155b, 155c and 155d respectively connected to emitters of the respective transistors Q1, Q2, Q3 and Q4 included in the pair of current mirror circuits 151a and 151b to adjust an amount of current flowing through each of the transistors Q1, Q2, Q3 and Q4.

In addition, as shown in FIG. 4, a collector terminal of the transistor Q1 included in the current mirror circuit 151a is connected to one end of the base current supply 153a through a terminal A, wherein the other end of the base current supply 153a is grounded, and a collector terminal of the transistor Q2 included in the current mirror circuit 151a is commonly connected to a collector terminal of the transistor Q3 included in the current mirror circuit 151b through a terminal B and one end of the base current supply 153b, wherein the other end of the base current supply 153b is grounded.

Further, a collector terminal of the transistor Q4 included in the current mirror circuit 151b is connected to the signal amplification unit 110 through a terminal C, and the terminals A and B are also connected to the signal amplification unit 110, respectively, which will be described in detail below.

Herein, since all the collector terminals of the transistors Q1 and Q2 and the transistors Q3 and Q4 included in the current mirror circuits 151a and 151b are p-type terminals, they may be electrically conducted to a p-type substrate, and in this case, the respective transistors may not be normally operated. Therefore, the transistors Q1 and Q2 and the transistors Q3 and Q4 included in the current mirror circuits 151a and 151b should use elements whose collector terminals are electrically isolated from the p-type substrate.

Figure 5:
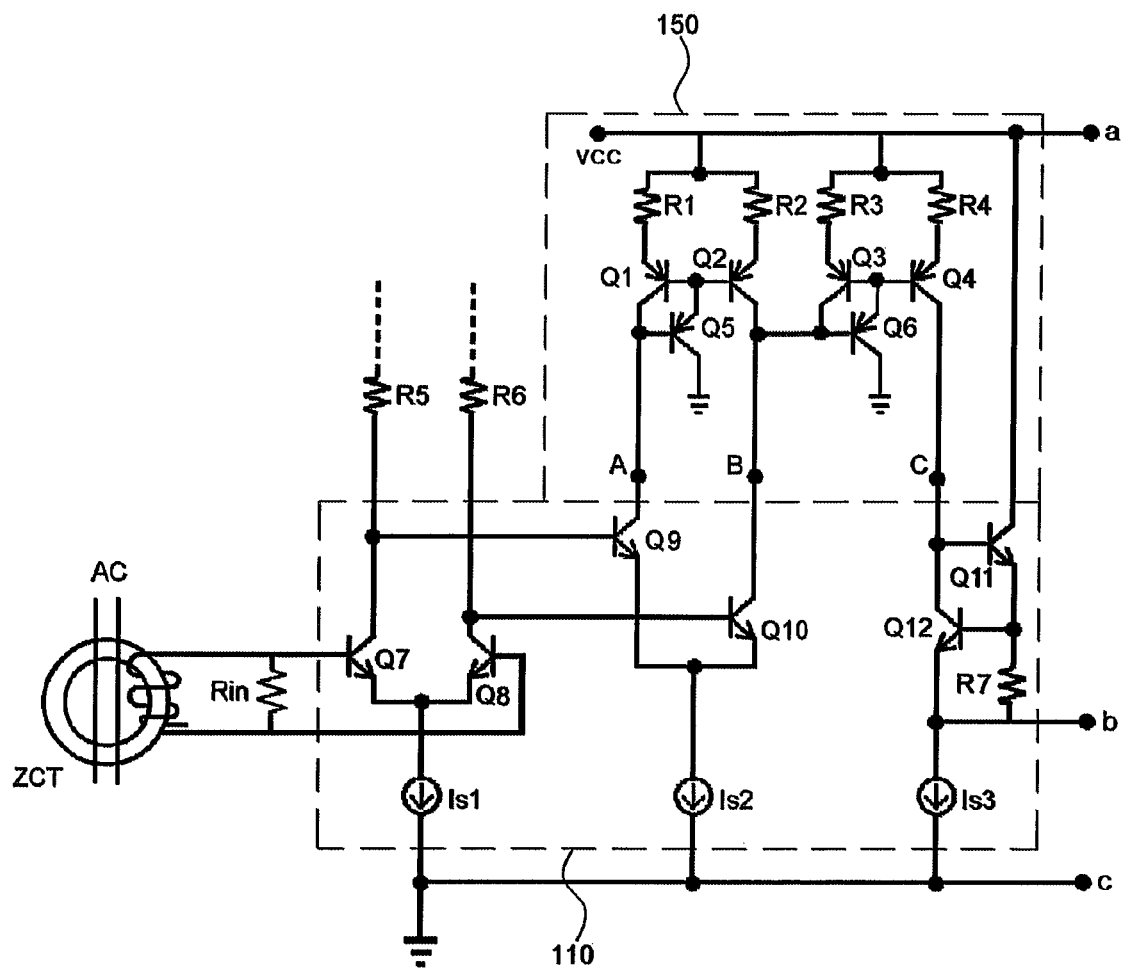
FIG. 5 is a circuit diagram illustrating an implemented example of a signal amplification unit according to the preferred embodiment of the present invention, to which the FCS circuit is applied.

Then, the signal amplification unit 110 to which the FCS circuit 150 for a signal amplification unit is applied will be described with reference to FIG. 5. FIG. 5 is a circuit diagram illustrating an implemented example of the signal amplification unit according to the preferred embodiment of the present invention, to which the FCS circuit is applied.

As shown in FIG. 5, the FCS circuit 150 for a signal amplification unit uses PNP type transistors Q5 and Q6 as the base current supplies 153a and 153b, respectively. Herein, a base of the transistor Q5 is connected to the collector of the transistor Q1 included in the current mirror circuit 151a through the terminal A, and a base of the transistor Q6 is commonly connected to the collector of the transistor Q3 included in the current mirror circuit 151b and the collector of the transistor Q2 included in the current mirror circuit 151a through the terminal B. Further, emitters of the transistors Q5 and Q6 are commonly connected to the bases of transistors Q1 and Q2 and transistors Q3 and Q4 included in the current mirror circuits 151a and 151b, respectively, and collectors thereof are grounded.

In addition, the FCS circuit 150 for a signal amplification unit uses resistors R1, R2, R3 and R4 as the current adjusters 155a, 155b, 155c and 155d for adjusting an amount of current flowing through the transistors Q1 and Q2 and the transistors Q3 and Q4 included in the current mirror circuits 151a and 151b, respectively, wherein one end of each of the resistors R1, R2, R3 and R4 is connected to a voltage source Vcc.

The signal amplification unit 110 includes a pair of NPN type transistors Q7 and Q8 whose bases are respectively connected to both output terminals of the input resistance Rin. Herein, collectors of the transistors Q7 and Q8 are respectively connected to a constant current source (not illustrated) which supplies a constant current to these collectors, and are respectively connected to bases of NPN type transistors Q9 and Q10, and emitters thereof are commonly connected to a constant current source Is1 which supplies a constant current to these emitters. Further, collectors of the transistors Q9 and Q10 are connected to terminals A and B of the FCS circuit 150 for a signal amplification unit, respectively, and emitters thereof are commonly connected to a constant current source Is2 which supplies a constant current to these emitters.

Further, the terminal C of the FCS circuit 150 for a signal amplification unit is commonly connected to a base of an NPN type transistor Q11 for controlling an output of the signal amplification unit 110 and a collector of an NPN type transistor Q12. Herein, a collector of the transistor Q11 is connected to the voltage source Vcc, and an emitter thereof is connected to a constant current source Is3 through a resistor R7 together with an emitter of the transistor Q12. In addition, one end of the resistor R7 and the emitter of the transistor Q12 are connected to the interruption determination unit 130, thus they are configured to output an output voltage amplified by the signal amplification unit 110 to the interruption determination unit 130.

A connection terminal a is connected to the voltage source Vcc of the FCS circuit 170 for an interruption determination unit, and connection terminals b and c are connected to the interruption determination unit 130 so as to output the output signal of the signal amplification unit 110 thereto.

Next, an operation of the FCS circuit 150 for a signal amplification unit will be described.

First, a voltage signal, which is detected by the leakage current detection unit 20 and converted into a voltage by the input resistance Rin, is amplified by each of the transistors Q7 and Q8 of the signal amplification unit 110 in a ratio of a collector current to a base current, and the amplified collector current is converted into a voltage by each of the collector resistors R5 and R6, and is output to the bases of transistors Q9 and Q10. Thereby, when the transistor Q1 included in the current mirror circuit 151a of the FCS circuit 150 for a signal amplification unit is operated to flow a current through the terminal A of the FCS circuit 150 for a signal amplification unit, the current flowing through the transistor Q1 is mirrored to the transistor Q2, such that the current flows to the terminal B. At this time, if the current flowing through the terminal A is cut off, the current flowing to the transistor Q2 is also cut off, then the current flows to the terminal B through the transistor Q3, and the current of the transistor Q3 is mirrored to the transistor Q4, such that the current flows through the terminal C. Therefore, the transistor Q11 and the transistor Q12 are operated by this current, and the signal amplified by the signal amplification unit 110 is output to the interruption determination unit 130.

Herein, a sum of the currents flowing through the transistor Q7 and the transistor Q8 is limited by the constant current source Is1, and a sum of the currents flowing through the transistor Q9 and the transistor Q10 is limited by the constant current source Is2. Therefore, an amount of current flowing through the transistors Q7 and Q8 and an amount of current flowing through the transistors Q9 and Q10 are the same as each other, and an amount of current drawn from the output of the signal amplification unit 110 is limited by the constant current source Is3.

Further, the transistors Q5 and Q6 of the base current supplies 153a and 153b of the FCS circuit 150 for a signal amplification unit prevent the base currents of the transistors Q1 and Q2 and the transistors Q3 and Q4 included in the current mirror circuits 151a and 151b from flowing to the collectors of transistors Q1 and Q2, respectively.

Furthermore, the currents flowing through the transistors Q1 and Q2 included in the current mirror circuit 151a and the currents flowing through the transistors Q3 and Q4 included in the current mirror circuit 151b are changed by a voltage Veb between the emitter and the base thereof, respectively. In the present embodiment, the current adjusters 155a, 155b, 155c and 155d can respectively adjust current values flowing through the transistors Q1, Q2, Q3 and Q4 using the respective resistors R1, R2, R3 and R4. The reason is that a temperature coefficient of resistance usually has a positive value, and the voltage Veb between the emitter and the base of the P-N junction transistor element depending on the temperature change has a negative value, such that changes in the amount of the currents can cancel each other.

Moreover, since a base current Ib1 of the transistor Q1 is usually $1/\beta$ times a collector current Ic1 (wherein $\beta$ has a value of about 50 to 200 depending on current amplification factors and current conditions), the base current Ib1 of the transistor Q1 becomes (collector current Ic1/$\beta$) of the transistor Q1, and since this value is substantially the same as a collector current Ic5 of the transistor Q5, a base current Ib5 of the transistor Q5 becomes ((Ic1/$\beta$)/$\beta$).

If there is no base current supply 153a in the FCS circuit 150 for a signal amplification unit of the present embodiment, the current flowing through terminal A becomes (Ic1+(Ic/$\beta$)), and the current flowing through terminal B is Ic2, wherein there is a relationship of Ic1≈Ic2. Therefore, a current error occurs by (Ic1/$\beta$). However, the current error becomes ((Ic1/$\beta$)/$\beta$) by the base current supply 153a of the present embodiment, and is reduced to 1/50-1/200 to 1/250-1/40,000 times the collector current Ic1 depending on the magnitude of $\beta$ compared to a case in which there is no base current supply 153a. Therefore, the current errors between transistor Q1 and transistor Q2 and between transistor Q3 and transistor Q4 may be greatly reduced, which is the same in transistor Q3 and transistor Q4 of the base current supply 153b.

The basic configuration of the interruption determination unit 130 is a technique known in the art, and the configuration and operation of the case in which the FCS circuit 170 for an interruption determination unit is applied to the interruption determination unit 130 is substantially the same as the above-described configuration and operation of the case in which the FCS circuit 150 for a signal amplification unit is applied to the signal amplification unit 110. Therefore, the configuration and operation of the case in which the FCS circuit 170 for an interruption determination unit is applied to the interruption determining unit 130 will not be described.

Figure 6A:
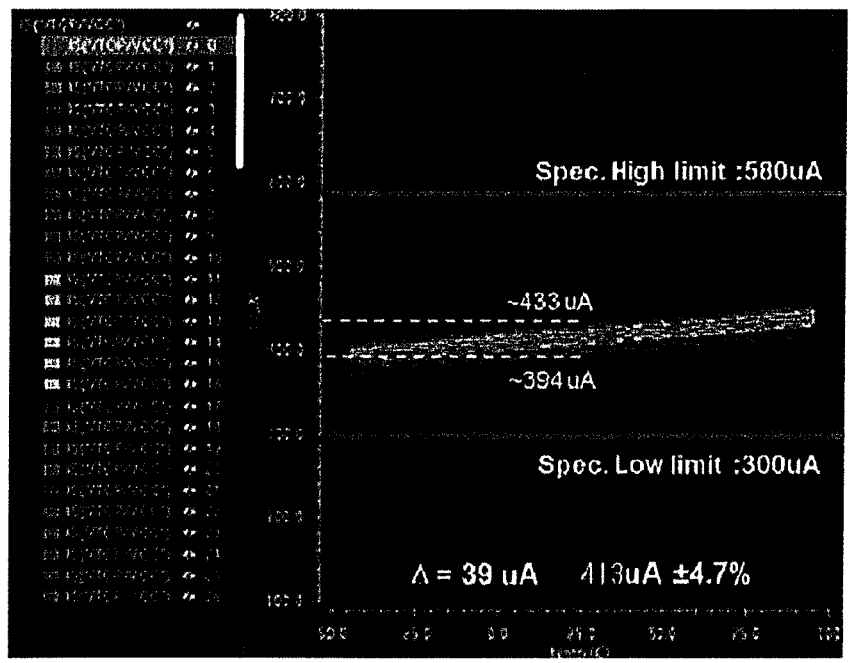
FIGS. 6A and 6B are diagrams illustrating simulated results of ICC values of a semiconductor integrated circuit for detecting leakage current depending on a temperature according to the preferred embodiment of the present invention.
Figure 6B:
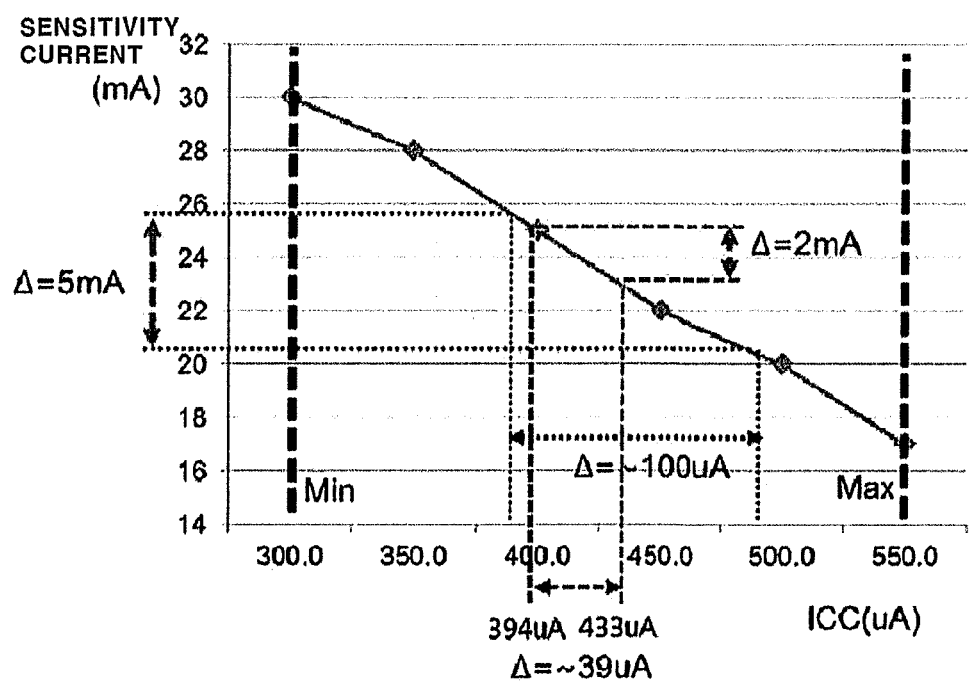

In order to confirm effects of the semiconductor integrated circuit 100 for detecting leakage current to which the FCS circuits of the present embodiment are applied, the present inventors simulated ICC values of the semiconductor integrated circuit 100 for detecting leakage current depending on the temperature, and determined a variation Δ in an ICC and a variation Δ in a sensitivity current of the earth leakage circuit breaker, and results thereof are as shown in FIGS. 6A and 6B.

FIGS. 6A and 6B are diagrams illustrating the simulated results of the ICC values in the semiconductor integrated circuit for detecting leakage current depending on the temperature according to the preferred embodiment of the present invention, wherein FIG. 6A and FIG. 6B shows the variation Δ in the ICC and the variation Δ in the sensitivity current of the earth leakage circuit breaker, respectively.

As shown in FIG. 6A, in the semiconductor integrated circuit 100 for detecting leakage current of the present embodiment, the variation Δ in the ICC is 39 μA, and as shown in FIG. 6B, the earth leakage circuit breaker having the semiconductor integrated circuit 100 for detecting leakage current of the present embodiment may maintain the variation Δ in the sensitivity current thereof within a range of 2 mA or less. Therefore, it can be seen that the requirement within a range of 5 mA or less, which is an upper limit of the variation Δ, in the sensitivity current range of the high-sensitivity type earth leakage circuit breaker defined in IEC61008, may be sufficiently satisfied.

DESCRIPTION OF REFERENCE NUMERALS

100: Semiconductor integrated circuit for detecting leakage current
110: Signal amplification unit
130: Interruption determination unit
150: FCS circuit for signal amplification unit
151a, 151b: Current mirror circuit
153a, 153b: Base current supply
155a, 155b, 155c, 155d: Current adjuster
170: FCS circuit for interruption determination unit
190: Interruption unit While the present invention has been described with reference to the preferred embodiment, the present invention is not limited to the above-described embodiment, and it will be understood by those skilled in the related art that various modifications and variations may be made therein without departing from the scope of the present invention as defined by the appended claims.

What is claimed is:

1. A semiconductor integrated circuit for detecting leakage current configured to determine whether an electric leakage occurs in an electric line based on an induced voltage input from a leakage current detection unit installed in the electric line, the semiconductor integrated circuit for detecting leakage current comprising:
   a signal amplification unit configured to amplify the induced voltage;
   an interruption determination unit configured to compare an output voltage output from the signal amplification unit with a preset reference voltage for determining whether to cut off an electrical power, and output an interruption signal for interrupting a power supply to the electric line when the output voltage is the reference voltage or more; and a flare current stabilization circuit for signal amplification unit connected to the signal amplification unit to stabilize a flare current in the signal amplification unit, thus to reduce a variation in a sensitivity current;

wherein the flare current stabilization circuit for signal amplification unit circuit comprises, a pair of current mirror circuits including a pair of transistors, respectively, base current supplies configured to supply the same amount of base current as each other to the pair of transistors included in each of the pair of current mirror circuits, and current adjusters connected to the respective transistors included in the pair of current mirror circuits to adjust an amount of current flowing through each of the transistors.

2. The semiconductor integrated circuit for detecting leakage current according to claim 1, further comprising a flare current stabilization circuit for interruption determination unit connected to the interruption determination unit to stabilize the flare current in the interruption determination unit, thus to reduce the variation in the sensitivity current.

3. The semiconductor integrated circuit for detecting leakage current according to claim 2, wherein the flare current stabilization circuit for an interruption determination unit comprises:

a pair of current mirror circuits including a pair of transistors, respectively;

base current supplies configured to supply the same amount of base current as each other to the pair of transistors included in each of the pair of current mirror circuits; and current adjusters connected to the respective transistors included in the pair of current mirror circuits to adjust an amount of current flowing through each of the transistors.

4. The semiconductor integrated circuit for detecting leakage current according to claim 1, wherein the base current supply for the flare current stabilization circuit for signal amplification unit circuit includes a PNP type transistor.

5. The semiconductor integrated circuit for detecting leakage current according to claim 4, wherein the transistor included in the base current supply for the flare current stabilization circuit for signal amplification unit circuit is a PNP type transistor having a structure whose collector is grounded with a substrate.

6. The semiconductor integrated circuit for detecting leakage current according to claim 3, wherein the base current supply of the flare current stabilization circuit for an interruption determination unit includes a PNP type transistor.

7. The semiconductor integrated circuit for detecting leakage current according to claim 6, wherein the transistor included in the base current supply of the flare current stabilization circuit for an interruption determination unit is a PNP type transistor having a structure whose collector is grounded with a substrate.

8. The semiconductor integrated circuit for detecting leakage current according to claim 1, wherein the current adjusters of the flare current stabilization circuit for signal amplification unit circuit comprise a resistor.

9. The semiconductor integrated circuit for detecting leakage current according to claim 3, wherein the current adjusters of the flare current stabilization circuit for an interruption determination unit comprise a resistor.

10. An earth leakage circuit breaker comprising:

the semiconductor integrated circuit for detecting leakage current including a signal amplification unit configured to amplify the induced voltage;

an interruption determination unit configured to compare an output voltage output from the signal amplification unit with a preset reference voltage for determining whether to cut off an electrical power, and output an interruption signal for interrupting a power supply to the electric line when the output voltage is the reference voltage or more; and a flare current stabilization circuit for a signal amplification unit connected to the signal amplification unit to stabilize a flare current in the signal amplification unit, thus to reduce a variation in a sensitivity current; and an interruption unit configured to cut off an electrical power to the electric line based on an interruption signal from the semiconductor integrated circuit for detecting leakage current;

wherein the flare current stabilization circuit for signal amplification unit circuit comprises, a pair of current mirror circuits including a pair of transistors, respectively, a base current supple cozfigur ed to supply the same amount of base current as each other to the pair of transistors included in each of the pair of current mirror circuits, and current adjusters connected to the respective transistors included in the pair of current minor circuits to adjust an amount of current flowing through each of the transistors.

11. An earth leakage circuit breaker according to claim 10, wherein the semiconductor integrated circuit for detecting leakage current further comprises a flare current stabilization circuit for interruption determination unit connected to the interruption determination unit to stabilize the flare current in the interruption determination unit, thus to reduce the variation in the sensitivity current.

12. An earth leakage circuit breaker according to claim 11, wherein the flare stabilization circuit for an interruption determination unit comprises:

a pair of current mirror circuits including a pair of transistors, respectively;

base current supplies configured to supply the same amount of base current as each other to the pair of transistors included in each of the pair of current mirror circuits; and current adjusters connected to the respective transistors included in the pair of current mirror circuits to adjust an amount of current flowing through each of the transistors.

* * * * *